(12) United States Patent
Yoon et al.

(10) Patent No.: US 8,673,779 B1
(45) Date of Patent: Mar. 18, 2014

(54) INTERCONNECT WITH SELF-FORMED BARRIER

(71) Applicant: Lam Research Corporation, Fremont, CA (US)

(72) Inventors: Hyungsuk A. Yoon, San Jose, CA (US); William T. Lee, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/779,512

(22) Filed: Feb. 27, 2013

(51) Int. Cl.
*H01L 21/44* (2006.01)

(52) U.S. Cl.
USPC .......... 438/687; 438/625; 438/627; 438/629; 438/637; 257/E21.575

(58) Field of Classification Search
USPC ......... 438/622, 625, 627–629, 637–641, 687; 257/E21.575, E21.579
See application file for complete search history.

(56) References Cited

U.S. PATENT DOCUMENTS

| | | | |
|---|---|---|---|
| 6,664,122 B1 | 12/2003 | Andryuschenko et al. | |
| 7,294,574 B2 | 11/2007 | Ding et al. | |
| 7,456,102 B1 | 11/2008 | Varadarjan et al. | |
| 7,501,014 B2 | 3/2009 | Poole et al. | |
| 7,651,934 B2 | 1/2010 | Lubomirsky et al. | |
| 7,659,197 B1 | 2/2010 | Juliano | |
| 2006/0270228 A1* | 11/2006 | Lee et al. | 438/687 |

* cited by examiner

*Primary Examiner* — Thanhha Pham
(74) *Attorney, Agent, or Firm* — Beyer Law Group LLP

(57) ABSTRACT

A method of filling of vias and trenches in a dual damascene structure with a filling comprising copper or copper alloy is provided. An electroless deposition filling of the vias with a via filling comprising copper or copper alloy is provided. A trench barrier layer is formed over the via filling with a trench barrier layer comprising Mn or Al. The trench barrier layer is annealed at a temperature that causes a component of the trench barrier layer to pass into the via filling. The trenches are filled with a trench filling comprising copper or copper alloy.

20 Claims, 4 Drawing Sheets

US 8,673,779 B1

INTERCONNECT WITH SELF-FORMED BARRIER

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. Generally, features are etched into a layer and then filled with a conductor, such as copper. Methods of filling etched features with copper are described in U.S. Pat. No. 7,294,574, entitled "Sputter Deposition and Etching of Metallization Seed Layer for Overhang and Sidewall Improvement," by Ding et al., issued Nov. 13, 2007; U.S. Pat. No. 7,659,197, entitled "Selective Resputtering of Metal Seed Layers," by Juliano, issued Feb. 9, 2010; U.S. Pat. No. 6,664,122 entitled "Electroless Copper Deposition Method for Preparing Copper Seed Layers," by Andryuschenko et al., issued Dec. 16, 2003; U.S. Pat. No. 7,456,102, entitled "Electroless Copper Fill Process," by Varadarajan et al., issued Nov. 25, 2008; U.S. Pat. No. 7,501,014 entitled "Formaldehyde Free Electroless Copper Compositions," by Poole et al., issued Mar. 10, 2009; and U.S. Pat. No. 7,651,934, entitled "Process for Electroless Copper Deposition," by Lubomirsky et al., issued Jan. 26, 2010, which are all incorporated by reference for all purposes.

SUMMARY OF THE INVENTION

To achieve the foregoing and in accordance with the purpose of the present invention, a method of filling of vias and trenches in a dual damascene structure with a filling comprising copper or copper alloy is provided. An electroless deposition filling of the vias with a via filling comprising copper or copper alloy is provided. A trench barrier layer is formed over the via filling with a trench barrier layer comprising Mn or Al. The trench barrier layer is annealed at a temperature that causes a component of the trench barrier layer to pass into the via filling. The trenches are filled with a trench filling comprising copper or copper alloy.

In another manifestation of the invention, a method for filling of vias and trenches in a dual damascene structure with a filling comprising copper or copper alloy is provided. An electroless deposition filling of the vias with a via filling comprising copper or copper alloy is provided. A trench barrier layer is formed over the via filling with a trench barrier layer comprising Mn or Al. The trenches are filled with a trench filling comprising copper or copper alloy. The trench filling is annealed at a temperature of less than 250° C. The trench barrier layer is annealed at a temperature greater than 300° C. that causes a component of the trench barrier layer to pass into the via filling and form a via barrier layer, after annealing the trench filling.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
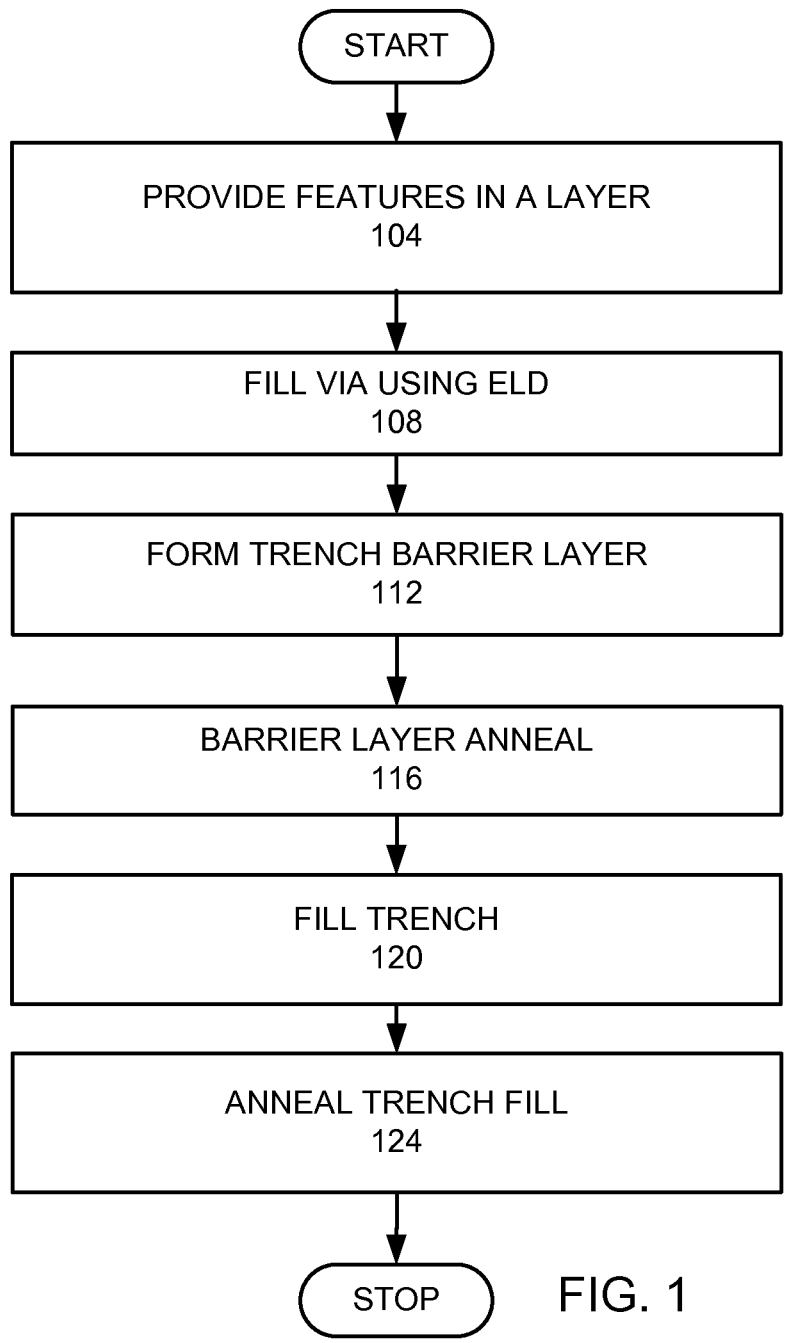
FIG. 1 is a flow chart of an embodiment of the invention.

FIG. 1 is a high level flow chart of an embodiment of the invention. In this embodiment, features are provided in a layer (step 104). In a preferred embodiment, the features form vias and trenches. The vias are filled using electroless deposition (ELD) (step 108). A trench barrier layer is formed over the via filling (step 112). The trench barrier layer is annealed (step 116). The annealing of the trench barrier layer causes at least one component of the trench barrier layer to migrate through the via filling to form or improve a via barrier layer. The trench is filled (step 120). The trench filling is annealed (step 124).

Figure 2A:
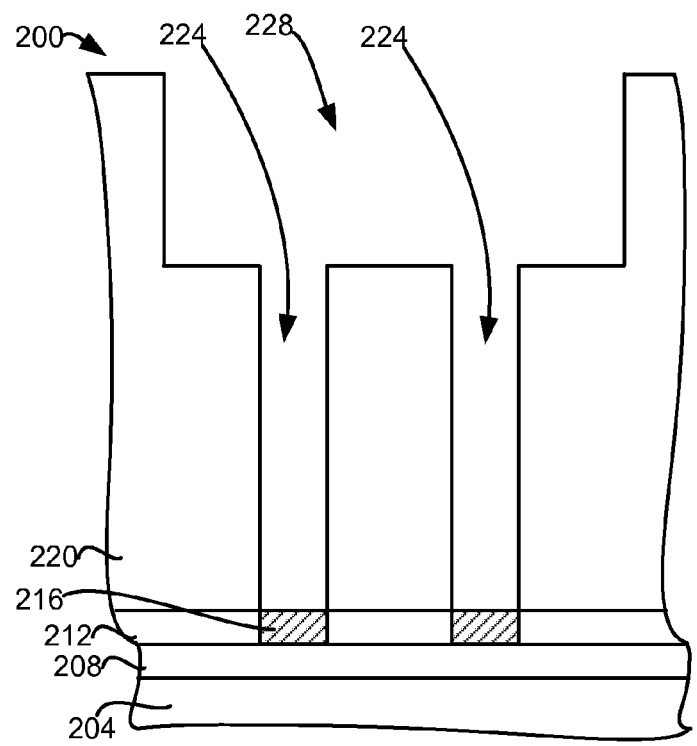
FIGS. 2A-E are schematic views of the formation of structures using the inventive process.

In a preferred embodiment of the invention, features are provided in a layer (step 104). FIG. 2A is a schematic cross-sectional view of a stack 200 with a substrate 204 with one or more intermediate layers 208. A conductor layer 212 with conductors 216. The conductor layer 212 may be a layer over semiconductor devices, a M-1 layer, so that the conductors 216 may be device contacts. In the alternative the conductive layer 212 may be a layer many layers above the semiconductor devices, such as a M-6 layer, where the conductors 216 may be conductor filled trenches in a lower layer, such as a M-5 layer. An interlayer dielectric layer 220 is above the conductor contact layer 212. Features are formed in the interlayer dielectric layer 220. In this embodiment, the features for a dual damascene structure of vias 224 and a trench 228. In this embodiment, the interlayer dielectric layer 220 is a low-k dielectric layer, with a k value of less than 4.0. In this embodiment, the layer is a low-k dielectric, such as Black Diamond II or Aurora. In this embodiment, the vias have a diameter of less than 32 nm. Preferably, the height of the vias is greater than 3 times the diameter of the vias. The small via diameter allows for the reduction of device size. However, the length of the vias is kept several times the diameter of the vias in order to reduce interlayer capacitance. The shrinking widths and large heights or depths increase the aspect ratio, which makes filling the vias more challenging using electroplating processes due to non-conformal PVD barrier/seed layers causing electroplating copper fill results with voids (incomplete fill) at the bottom of the vias.

Figure 2B:
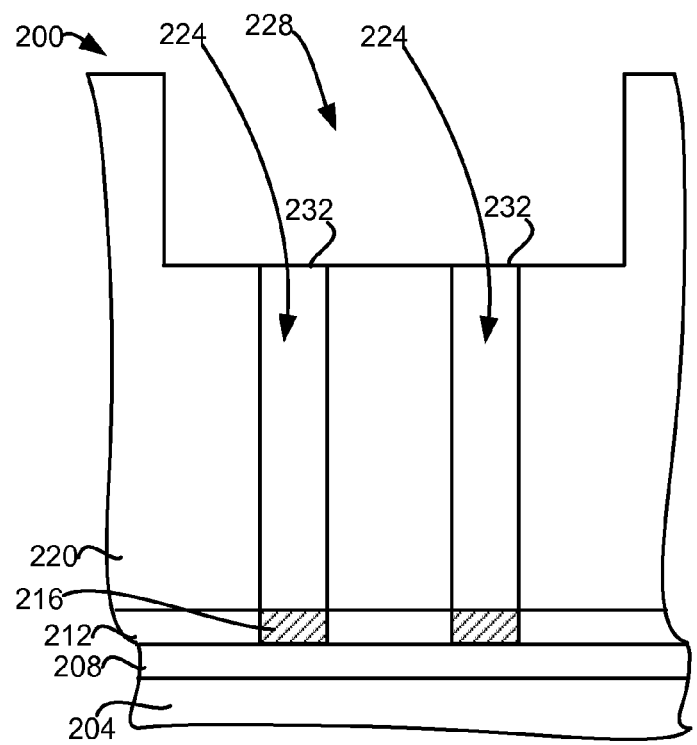

The vias are filled using electroless deposition (step 108). FIG. 2B is a schematic cross-sectional view of the stack 200 after the vias 224 are filled with a via fill 232. The via fill 232 is a conductive material, such as a copper or copper alloy.

Figure 2C:
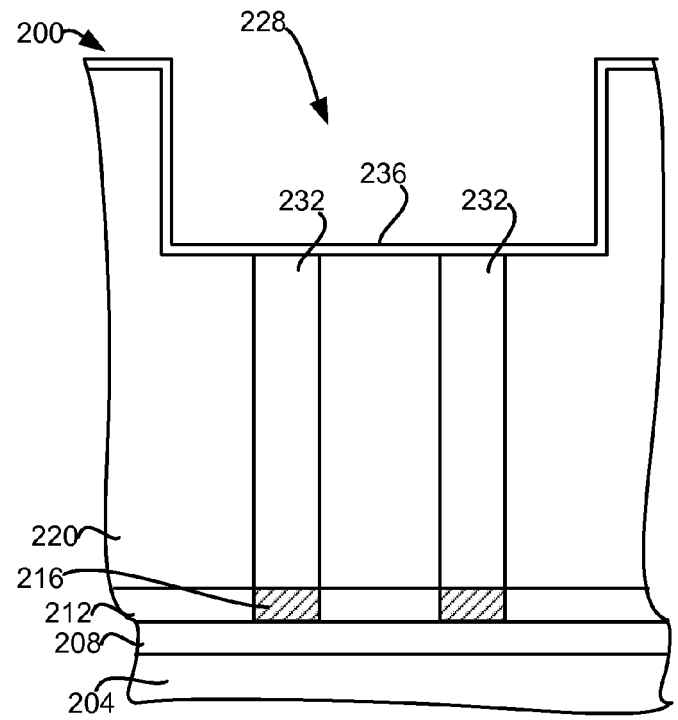

A trench barrier layer is formed (step 112). FIG. 2C is a schematic cross-sectional view of the stack 200 after a trench barrier layer 236 is formed. Preferably, the barrier layer 236 comprises at least one of Mn and Al. More preferably, the trench barrier layer 236 comprises Mn. In a preferred embodiment, the barrier layer 236 is TaMn. The TaMn barrier layer may be a layer of a TaMn alloy or may be a layer first of Mn over which a layer of Ta is placed.

Figure 2D:
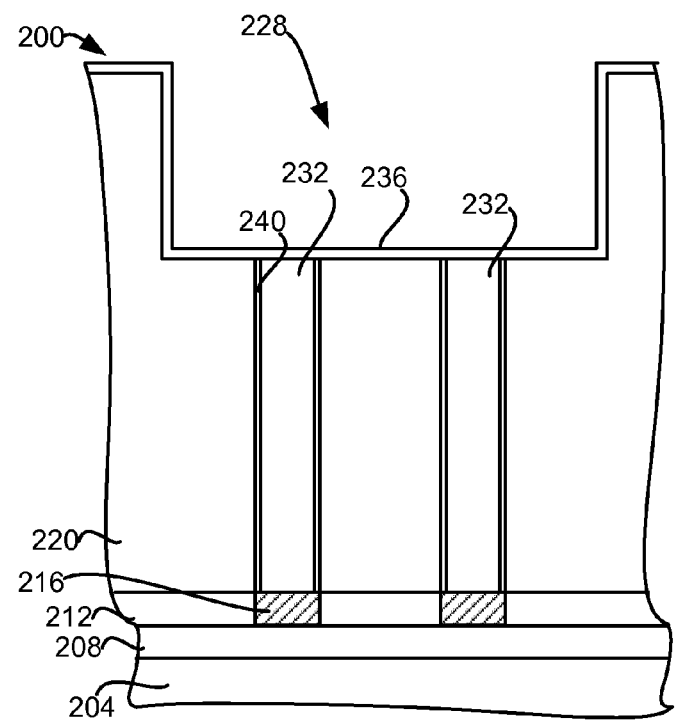

The barrier layer is annealed (step 116). FIG. 2D is a schematic cross-sectional view of the stack 200 after the barrier layer 236 is annealed. The annealing causes components of the trench barrier layer 236, such as the Mn, to migrate through the via fill 232 to form a via barrier layer 240 between the via fill 232 and sidewalls of the via features. Preferably, a temperature of at least 300° C. is provided during the annealing of the trench barrier layer 236. More preferably, a temperature of between 350° C. and 450° C. is provided during the annealing of the trench barrier layer 236. Most preferably, a temperature of between 375° C. and 400° C. is provided during the annealing of the trench barrier layer 236.

Figure 2E:
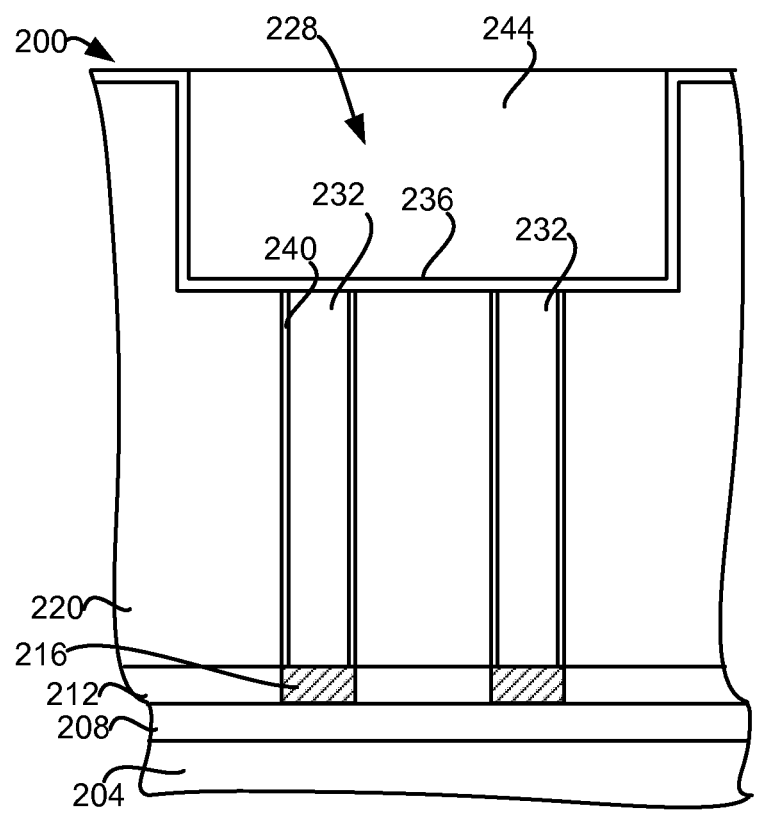

The trench is filled (step 120). FIG. 2E is a schematic cross-sectional view of the stack 200 after the trench 228 is filled with a trench fill 244. Preferably, the trench fill 244 is a conductive material. More preferably, the trench fill 244 is a copper or copper alloy.

The trench fill is annealed (step 124). The annealing of the trench fill 244 is at a lower temperature, and cause copper grain growth. Preferably, a temperature of less than 250° C. is provided during the annealing of the trench fill 244. More preferably, a temperature of between 100° C. and 200° C. is provided during the annealing of the trench fill 244. Most preferably, a temperature of between 125° C. and 150° C. is provided during the annealing of the trench fill 244.

This embodiment provides a via barrier layer for vias with a diameter of less than 32 nm and an aspect ratio greater than 17:1. It has been found that this embodiment provides an improved via barrier layer, compared with other via barrier layer deposition processes, such as using physical vapor deposition (PVD) to deposit a barrier layer directly on sidewalls of the vias. This process may be repeated for subsequent via and trench features in subsequent layers. Preferably the vias have an aspect ratio of at least 3:1. More preferably, the vias have an aspect ratio of at least 10:1. Most preferably, the vias have an aspect ratio of great than 17:1.

In other embodiments of the invention, the trench fill and trench anneal may be provided before annealing the trench barrier layer. In other embodiments of the invention, a via barrier layer may be deposited before filling the vias. Such a via barrier may be deposited by sputtering TaN. In such embodiments, forming the trench barrier layer from aluminum (Al) or manganese (Mn) and then annealing the trench barrier layer improves the via barrier layer. Other processes such as planarization of the trench fill also may be provided. In other embodiments, a seed layer may be deposited on the trench barrier layer, before depositing the trench fill. In some embodiments, the conductors are exposed by sputtering at the bottoms of the vias, so that electroless deposition is on the conductors. In other embodiment, other processes may be used to expose the conductors below the bottoms of the vias.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for filling of vias and trenches in a dual damascene structure with a filling comprising copper or copper alloy, comprising:
   providing an electroless deposition filling of the vias with a via filling comprising copper or copper alloy;
   forming a trench barrier layer over the via filling with a trench barrier layer comprising Mn or Al;
   annealing the trench barrier layer at a temperature that causes a component of the trench barrier layer to pass into the via filling; and
   filling the trenches with a trench filling comprising copper or copper alloy.

2. The method, as recited in claim 1, further comprising forming a trench seed layer after forming the trench barrier layer and before filling the trenches.

3. The method, as recited in claim 2, further comprising annealing the trench filling after annealing the trench barrier.

4. The method, as recited in claim 3, wherein the annealing the trench filling is at a temperature of less than 250° C. and wherein the annealing the trench barrier layer is at a temperature greater than 300° C.

5. The method, as recited in claim 4, wherein conductors are in a layer below bottoms of the vias, and further comprising exposing the conductors below the bottoms of the vias.

6. The method, as recited in claim 5, wherein the trench barrier layer is formed from at least one of WMn, TiMn, TaMn, WAl, TiAl, or TaAl.

7. The method, as recited in claim 5, wherein the trench barrier layer is formed from TaMn.

8. The method, as recited in claim 7, wherein the trench filling further comprises electrode copper deposition.

9. The method, as recited in claim 8, wherein the via filling is pure copper.

10. The method, as recited in claim 1, further comprising annealing the trench filling after annealing the trench barrier.

11. The method, as recited in claim 3, wherein the annealing the trench filling is at a temperature of less than 250° C. and wherein the annealing the trench barrier layer is at a temperature greater than 300° C.

12. The method, as recited in claim 1, wherein conductors are in a layer below bottoms of the vias, and further comprising exposing the conductors below the bottoms of the vias.

13. The method, as recited in claim 1, wherein the trench barrier layer is formed from at least one of WMn, TiMn, TaMn, WAl, TiAl, or TaAl.

14. The method, as recited in claim 1, wherein the trench barrier layer is formed from TaMn.

15. The method, as recited in claim 1, wherein the trench filling further comprises electrode copper deposition.

16. The method, as recited in claim 1, wherein the via filling is pure copper.

17. The method, as recited in claim 1, wherein the annealing the trench barrier layer causes the a component of the trench barrier layer to form a via barrier layer.

18. A method for filling of vias and trenches in a dual damascene structure with a filling comprising copper or copper alloy, comprising:
   providing an electroless deposition filling of the vias with a via filling comprising copper or copper alloy;
   forming a trench barrier layer over the via filling with a trench barrier layer comprising Mn or Al;
   filling the trenches with a trench filling comprising copper or copper alloy;
   annealing the trench filling at a temperature of less than 250° C.; and annealing the trench barrier layer at a temperature greater than 300° C. that causes a component of the trench barrier layer to pass into the via filling and form a via barrier layer, after annealing the trench filling.

19. The method, as recited in claim 18, further comprising forming a trench seed layer after forming the trench barrier layer and before filling the trenches.

20. The method, as recited in claim 18, wherein conductors are in a layer below bottoms of the vias, and further comprising exposing the conductors below the bottoms of the vias.

* * * * *